United States Patent
Wu

(10) Patent No.: US 9,209,213 B2
(45) Date of Patent: Dec. 8, 2015

(54) THIN-TYPE IMAGE CAPTURING MODULE STRUCTURE FOR A WEB CAM

(75) Inventor: Jun-De Wu, Taipei (TW)

(73) Assignee: KYE SYSTEMS CORP., Taipei (TW)

( * ) Notice: Subject to any disclaimer, the term of this patent is extended or adjusted under 35 U.S.C. 154(b) by 1538 days.

(21) Appl. No.: 11/882,962

(22) Filed: Aug. 8, 2007

(65) Prior Publication Data

US 2009/0009611 A1    Jan. 8, 2009

(30) Foreign Application Priority Data

Jul. 6, 2007   (TW) ................ 96124582 A

(51) Int. Cl.
  *H01L 27/146* (2006.01)
  *H04N 5/225* (2006.01)
  *H05K 1/14* (2006.01)
  *H05K 1/18* (2006.01)

(52) U.S. Cl.
  CPC ........ *H01L 27/14618* (2013.01); *H04N 5/2253* (2013.01); *H04N 5/2257* (2013.01); *H05K 1/141* (2013.01); *H01L 2924/0002* (2013.01); *H05K 1/182* (2013.01); *H05K 2201/049* (2013.01); *H05K 2201/09072* (2013.01); *H05K 2201/10121* (2013.01)

(58) Field of Classification Search
  USPC .................. 348/340, 373–376; 257/291, 294
  See application file for complete search history.

(56) References Cited

U.S. PATENT DOCUMENTS

| | | | | |
|---|---|---|---|---|
| 6,011,294 A * | 1/2000 | Wetzel | ................ | H01L 31/0203 257/434 |
| 6,266,197 B1 * | 7/2001 | Glenn | ................ | H01L 24/97 348/E5.028 |
| 6,300,676 B1 * | 10/2001 | Kawai | ................ | B81B 7/007 257/678 |
| 6,313,729 B1 * | 11/2001 | Winterer | ................ | G01L 19/003 257/417 |
| 6,396,116 B1 * | 5/2002 | Kelly | ................ | H01L 27/14618 257/215 |
| 6,646,316 B2 * | 11/2003 | Wu | ................ | H01L 31/0203 257/433 |
| 6,740,973 B1 * | 5/2004 | Hsin | ................ | H01L 25/167 257/432 |
| 7,112,864 B2 * | 9/2006 | Tsukamoto et al. | ................ | 257/433 |
| 7,138,695 B2 * | 11/2006 | Kim | ................ | H01L 27/14618 257/433 |
| 7,151,251 B2 * | 12/2006 | Kim | ................ | H04N 5/2253 250/208.1 |
| 7,443,028 B2 * | 10/2008 | Satou | ................ | H01L 27/14618 257/734 |
| 8,659,105 B2 * | 2/2014 | Takeshita | ................ | H01L 27/14618 257/432 |
| 2003/0223008 A1 * | 12/2003 | Kim et al. | ................ | 348/340 |
| 2004/0069998 A1 * | 4/2004 | Harazono | ................ | H01L 27/14618 257/81 |
| 2005/0012170 A1 * | 1/2005 | Hsieh | ................ | H01L 31/0203 257/435 |
| 2005/0059269 A1 * | 3/2005 | Kim et al. | ................ | 439/66 |
| 2006/0001761 A1 * | 1/2006 | Haba | ................ | H01L 27/14618 348/340 |
| 2006/0110097 A1 * | 5/2006 | Gobara | ................ | H01L 27/14618 385/14 |
| 2006/0164539 A1 * | 7/2006 | Van Arendonk et al. | ..... | 348/340 |
| 2006/0202318 A1 * | 9/2006 | Satou | ................ | H01L 27/14618 257/686 |
| 2007/0040932 A1 * | 2/2007 | Chen | ................ | 348/374 |
| 2007/0252227 A1 * | 11/2007 | Fukuda | ............. | H01L 27/14618 257/432 |
| 2008/0017940 A1 * | 1/2008 | Yang | ................ | 257/432 |
| 2008/0099866 A1 * | 5/2008 | Chang et al. | ................ | 257/433 |
| 2008/0251872 A1 * | 10/2008 | Kwon | ............... | H01L 27/14618 257/432 |
| 2012/0104524 A1 * | 5/2012 | Takeshita | .......... | H01L 27/14618 257/432 |

* cited by examiner

Primary Examiner — Michael Osinski
(74) Attorney, Agent, or Firm — Bacon & Thomas, PLLC

(57) ABSTRACT

An image capturing module of a web cam device, and particularly to a thin-type web cam device, includes a circuit board having circuit lines and a through opening. A substrate plate having contacts attaches to the bottom of the circuit board. An image sensor is covered by a transparent shield. The image sensor and the shield are carried by the substrate plate and located within the through opening.

6 Claims, 3 Drawing Sheets

THIN-TYPE IMAGE CAPTURING MODULE STRUCTURE FOR A WEB CAM

BACKGROUND OF THE INVENTION

1. Field of the Invention

The present invention relates to an image capturing module for a web cam device, and in particular a thin-type web cam device in which an image sensor and transparent shield are carried by a substrate plate so as to be situated within a through opening in a circuit board and thereby reduce the thickness of the image capturing module.

2. Description of the Prior Art

FIGS. 4, and 5 show a conventional image capturing module for a web cam device. The image capturing module 60 has a substrate plate 61, an image sensor 62, and a transparent shield 63. The substrate plate 61 has contacts 611 on the upper side for connecting to the sensor 62, and contacts of a circuit 612 on the lower side for connecting to the circuit lines 71 of a circuit board 70.

The thickness of the image capturing module 60 therefore consists at least of the accumulated thickness of the shield 63, the sensor 62, the substrate 61, and the circuit board 70. As a result, it is difficult to apply the conventional image capturing module to a thin-type web cam device.

SUMMARY OF THE DISCLOSURE

It is an objective of the present invention to provide an image capturing module structure for a thin-type web cam device.

To accomplish the objective mentioned above, a preferred embodiment of the invention includes a circuit board 30 having circuit lines 32 and a through opening 31. A substrate plate 10 having contacts 11 attaches to the bottom of the circuit board 30. An image sensor 20 is covered by a transparent shield 40. The image sensor 20 and the shield 40 are carried by the substrate plate 10 and located within the through opening 31.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention.

Figure 1:
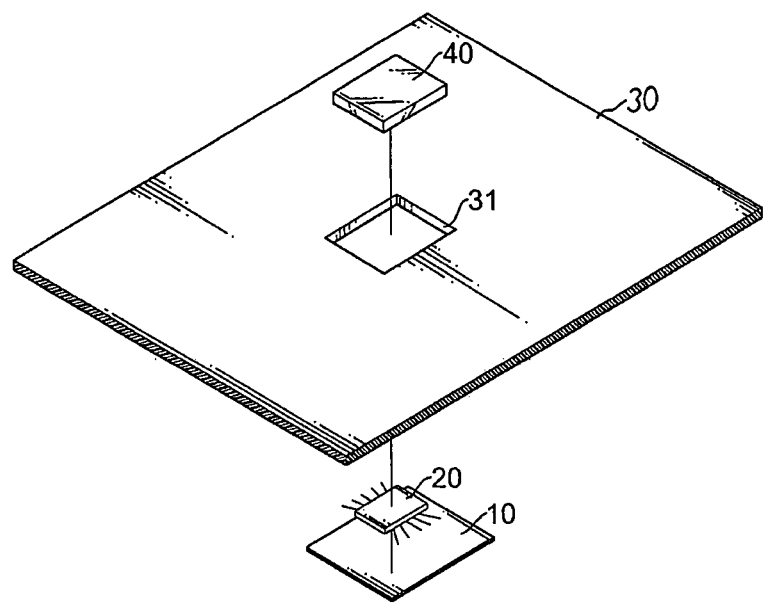
FIG. 1 is an exploded perspective view of a preferred embodiment of the present invention.
Figure 2:
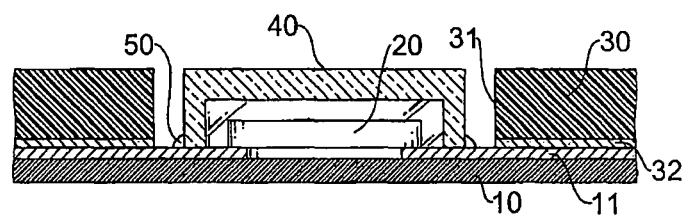
FIG. 2 is a cross-sectional view of the preferred embodiment.
Figure 3:
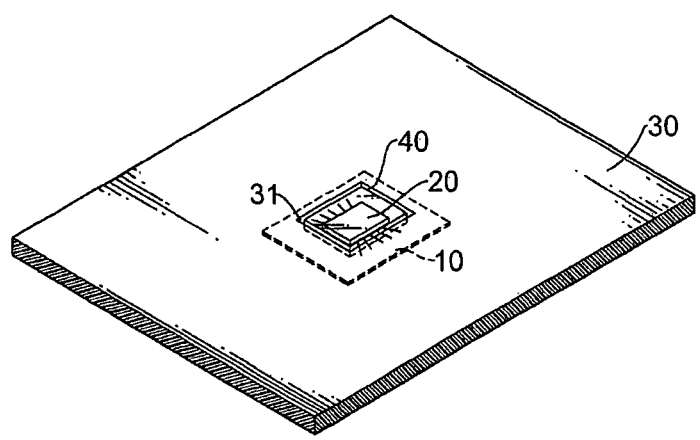
FIG. 3 is a perspective view of the preferred embodiment.
Figure 4:
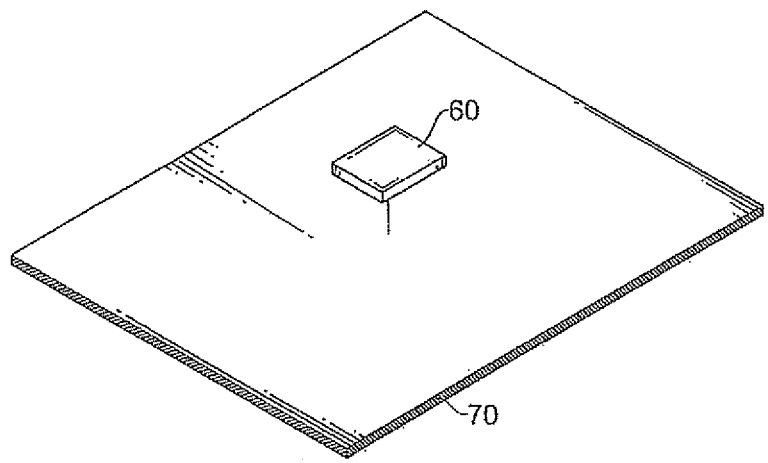
FIG. 4 is a perspective view of a prior art web cam image capturing module.
Figure 5:
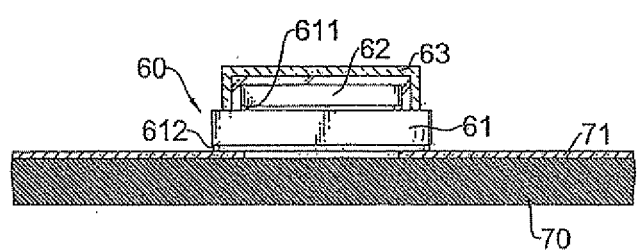
FIG. 5 is a cross-sectional view of the prior art image capturing module.

Referring to FIGS. 1, 2, and 3, a thin-type image capturing module for a web cam includes a circuit board 30 having circuit lines 32 and a through opening 31. A substrate plate 10 having contacts 11 attaches to the bottom of the circuit board 30. An image sensor 20 is covered by a transparent shield 40. The image sensor 20 and the shield 40 are carried by the substrate plate 10 and located within the through opening 31.

The sensor 20 electronically couples to the contacts 11 of the substrate 10, and the circuit lines 32 of the circuit board 30 electronically couple to the contacts 11 of the substrate 10. The circuit lines 32 of the circuit board are soldered to the contacts 11 of the substrate 10. The transparent shield 40 can be adhered to the substrate 10, for example by an ultraviolet curable adhesive.

The substrate 10 may be selected from the group consisting of a flexible printed circuit board, a ceramic substrate plate, and a glass substrate plate, although the invention is not intended to be limited to a particular type of substrate. In addition, the circuit board may be a printed circuit board or other board with circuit lines such as traces or wires thereon.

Due to the structure mentioned above, the image capturing module can be applied to a thin-type web cam device. It may of course also be used in a regular web cam device.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A thin-type image capturing module for a web cam device, comprising:
   a circuit board having a plurality of circuit lines and a through opening;
   an image sensor;
   a substrate plate having a plurality of contacts and attached to the bottom of the circuit board such that the substrate plate forms a bottom of the through opening, the through opening being situated above the substrate plate, and the through opening being larger than the image sensor such that a gap is present between the image sensor and the circuit board;
   wherein the image sensor is carried by the substrate plate and located in the through opening of the circuit board, said through opening extending above the substrate plate such that the image sensor is substantially level with the circuit board rather than below the circuit board; and
   wherein the image sensor is electronically coupled to the contacts of the substrate plate; and the circuit lines of the circuit board are electronically coupled to the contacts of the substrate plate such that the contacts of the substrate plate electronically couple the image sensor to the circuit lines of the circuit board.

2. The thin-type image capturing module for a web cam as claimed in claim 1, wherein the substrate plate is selected from a group consisting of a flexible printed circuit board, a ceramic substrate plate, and a glass substrate plate.

3. The thin-type image capturing module for a web cam as claimed in claim 1, wherein the circuit lines of the circuit board are soldered to the contacts of the substrate plate.

4. The thin-type image capturing module for a web cam as claimed in claim 1, wherein the image sensor is covered by a transparent shield.

5. The thin-type image capturing module for a web cam as claimed in claim 4, wherein the transparent shield is located within the through opening, said transparent shield extending into said gap between the image sensor and the circuit board to be carried by the substrate plate.

6. The thin-type image capturing module for a web cam as claimed in claim 4, wherein the transparent shield is adhered to the substrate plate by an ultraviolet curable adhesive.

* * * * *